United States Patent
Kwak et al.

(10) Patent No.: US 8,502,192 B2
(45) Date of Patent: Aug. 6, 2013

(54) LED WITH UNIFORM CURRENT SPREADING AND METHOD OF FABRICATION

(75) Inventors: Joon Seop Kwak, Jeonnam (KR); Min Joo Park, Jeonnam (KR); Fareen Adeni Khaja, Gloucester, MA (US); Chi-Chun Chen, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 262 days.

(21) Appl. No.: 12/987,655

(22) Filed: Jan. 10, 2011

(65) Prior Publication Data

US 2011/0168972 A1 Jul. 14, 2011

Related U.S. Application Data

(60) Provisional application No. 61/294,126, filed on Jan. 12, 2010.

(51) Int. Cl.
*H01L 29/06* (2006.01)
*H01L 21/20* (2006.01)
*H01L 21/36* (2006.01)

(52) U.S. Cl.
USPC ............... 257/13; 257/E21.09; 257/E33.008; 438/478

(58) Field of Classification Search
USPC .......................................... 257/13; 438/478
See application file for complete search history.

(56) References Cited

U.S. PATENT DOCUMENTS

| | | | |
|---|---|---|---|
| 5,593,798 A | 1/1997 | Muller et al. | |
| 6,156,582 A * | 12/2000 | Shieh et al. | 438/29 |
| 6,900,121 B1 | 5/2005 | Ngo et al. | |
| 2003/0205971 A1 | 11/2003 | Chang et al. | |
| 2003/0214807 A1 * | 11/2003 | Liu | 362/100 |
| 2005/0179045 A1 * | 8/2005 | Ryu et al. | 257/94 |
| 2006/0255358 A1 * | 11/2006 | Shum | 257/99 |
| 2007/0007584 A1 * | 1/2007 | Hwang et al. | 257/324 |
| 2007/0012930 A1 * | 1/2007 | Liu et al. | 257/80 |
| 2007/0023772 A1 * | 2/2007 | Watanabe et al. | 257/94 |
| 2007/0145380 A1 * | 6/2007 | Shum et al. | 257/79 |
| 2007/0205429 A1 * | 9/2007 | Kim | 257/103 |
| 2008/0035936 A1 | 2/2008 | Lester | |
| 2008/0299687 A1 | 12/2008 | Song et al. | |
| 2010/0147835 A1 * | 6/2010 | Mulpuri et al. | 219/759 |
| 2010/0258834 A1 * | 10/2010 | Liu et al. | 257/98 |
| 2010/0258835 A1 * | 10/2010 | Hsu | 257/99 |
| 2011/0147790 A1 * | 6/2011 | Chen | 257/101 |
| 2012/0097918 A1 * | 4/2012 | Yu et al. | 257/13 |

* cited by examiner

*Primary Examiner* — William D Coleman
*Assistant Examiner* — Igwe U Anya

(57) ABSTRACT

A lateral light emitting diode comprises a layer stack disposed on one side of a substrate, the layer stack including a p-type layer, n-type layer, and a p/n junction formed therebetween. The LED may further include a p-electrode disposed on a first side of the substrate and being in contact with the p-type layer on an exposed surface and an n-electrode disposed on the first side of the substrate and being in contact with an exposed surface of an $n^+$ sub-layer of the n-type layer.

20 Claims, 4 Drawing Sheets

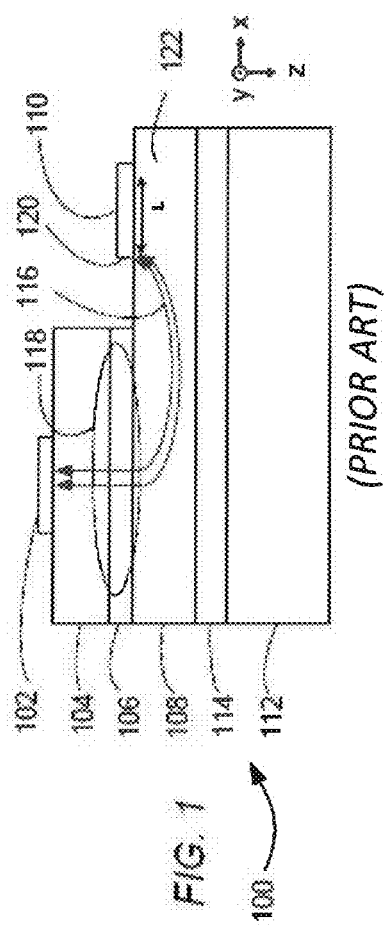
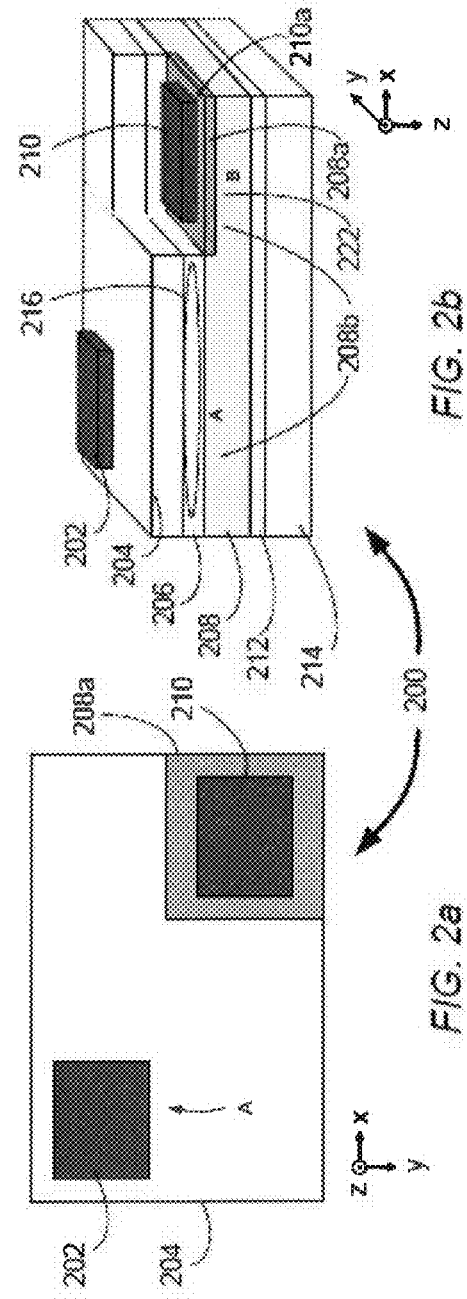

US 8,502,192 B2

LED WITH UNIFORM CURRENT SPREADING AND METHOD OF FABRICATION

CROSS-REFERENCE TO RELATED APPLICATIONS

This application claims priority to U.S. Provisional Application No. 61/294,126 filed Jan. 12, 2010 which is herein incorporated by reference in its entirety.

FIELD

This invention relates to ion implantation of light emitting diodes (LEDs) and, more particularly, to ion implantation of light emitting diodes to affect current crowding and surface roughness.

BACKGROUND

LEDs are built on a substrate and are doped with impurities to create a p-n junction. A current flows from the p-side, or anode, to the n-side, or cathode, but not in the reverse direction. Electrons and holes flow into the p-n junction from electrodes with different voltages. If an electron combines with a hole, it falls into a lower energy level and releases energy in the form of a photon. The wavelength of the light emitted by the LED and the color of the light may depend on the band gap energy of the materials forming the p-n junction.

LED devices are typically formed by initially forming a stack of layers in which one or more layers are p-type semiconductors and one or more layers are n-type semiconductors, such that a p/n junction forms within the layer stack. The stack of layers may be formed on a planar insulating substrate in some cases. The insulating substrate in an LED may be, for example, sapphire. Vertical LED structures include a p-contact (electrode) on one side of the stack of layers while an n-contact is formed on the other side of the stack of layers. Lateral LED structures include a p-contact and n-contact on the same side of a substrate (or same side of a stack of layers).

FIG. 1 illustrates a cross-section of a known lateral LED structure 100 formed using GaN as the semiconductor material. LED 100 includes a p-contact 102 that is used to contact p-GaN layer 104 on its exposed outer surface. An InGaN quantum well structure 106 is sandwiched between p-layer 104 and an n-GaN layer 108. An exposed region of the n-GaN layer forms a mesa 122 that is recessed with respect to the surface of the p-GaN layer. LED 100 also includes an n-contact 110 that is formed on the same side of substrate 112 as the p-contact 102 on an exposed surface of n-GaN layer 108. A buffer layer 114 is also formed to help match the substrate to the n-GaN layer 108.

The stepped structure of LED 100 in which a portion of the inner layer 108 has an exposed outer surface facing the same direction as the outer surface of p-layer 104 allows non-buried planar contacts to be formed on the same side of the layer stack 104-114, in which the contacts 102, 110 are displaced laterally from one another along the x-direction as shown. Accordingly, although the current 116 travels across the p/n junction of LED 100 in z-direction normal to the P/N junction (a vertical direction for the LED orientation shown in FIG. 1), the current must travel in a horizontal fashion (x-direction) generally parallel to the p/n junction between n-contact 110 and the region of the p/n junction 118, which is formed between layers 104 and 108. In the vicinity of contact 110 the current changes direction between a predominantly horizontal flow and a more vertical flow that exists immediately under at least the edge 120 of contact 110.

Such a lateral LED structure may therefore suffer from current crowding near the contacts, especially the re-contact, which degrades the LED performance. Current always takes a path of least resistance, which for the case of lateral LED structure 100 may be across or near the edge 120 of the contact 110. Thus, the current may not spread under the entire contact length L. In one instance, the voltage may be highest at the contact edge and drop exponentially with distance from the contact. Such non-uniform current spreading near LED contacts results in localized joule heating and light emission. This may cause color binning, early saturation of light intensity, and a short LED device lifetime.

Accordingly, it is desirable to provide improvements over present day LEDs.

SUMMARY

In an embodiment, a lateral light emitting diode comprises a substrate supporting a layer stack that includes a p-type layer, n-type layer, and a p/n junction formed therebetween. The LED may further include a p-electrode disposed on a first side of the substrate and being in contact with the p-type layer, and an n-electrode disposed on the first side of the substrate and being in contact with an exposed surface of an $n^+$ sublayer of the n-type layer.

In another embodiment, a method of forming a light emitting diode includes etching a portion of device structure comprising an n-type layer disposed towards a substrate, an outer p-type layer, and a p/n junction formed therebetween, so as to expose a portion of the n-type layer. The method also may include introducing dopants into an outer portion of the exposed n-type region so as to form an $n^+$ outer layer.

BRIEF DESCRIPTION OF THE DRAWINGS

For a better understanding of the present disclosure, reference is made to the accompanying drawings, which are incorporated herein by reference and in which:

FIG. 1 is a cross-sectional view of a known LED structure;

FIG. 2a is a top plan view of an embodiment of an LED;

FIG. 2b is a perspective view of a portion of the LED structure of FIG. 2a;

DETAILED DESCRIPTION

Figure 3:
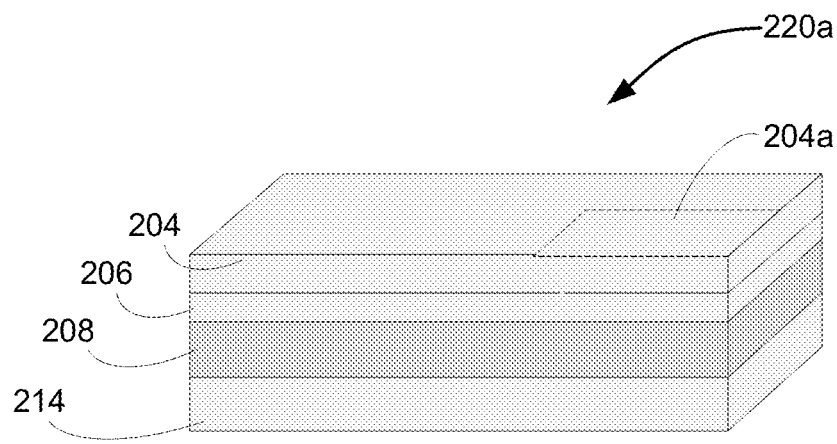
FIG. 3 is a perspective view of a first step in an embodiment of LED fabrication.

To address some of the deficiencies in the aforementioned LEDs, embodiments are described herein that provide improved LED architecture and performance. LED device structures and their methods of formation are described herein in connection with an ion implantation of LEDs. However, the method can be used with other semiconductor manufacturing processes. A beam-line ion implanter, plasma doping ion implanter, or other ion implantation system known to those skilled in the art may be used in the embodiments described herein. Thus, the invention is not limited to the specific embodiments described below.

LED performance is governed by internal quantum efficiency, light extraction efficiency, and packaging. The total LED efficiency is represented by the formula:

$$\eta_{total} = \eta_{internal} + \eta_{electrical} + \eta_{extraction} + \eta_{packaging}$$

where $\eta_{total}$ represents the total LED efficiency. $\eta_{internal}$ represents the internal quantum efficiency and can be increased by improved crystal quality in the LED, such as using a substrate with a lower defect density. $\eta_{internal}$ also may be increased by improving quantum well growth during the epitaxial growth process. $\eta_{electrical}$ represents the electrical efficiency and can be increased by improving the crystal quality such that carrier mobility is improved. $\eta_{electrical}$ also may be increased by having a more uniform current distribution without carrier overflow, heat generation, and improved ohmic contracts. $\eta_{extraction}$ represents the extraction efficiency and may be increased by varying the LED structure, LED die shaping, surface texturing, the transparency of contacts, or reflective mirrors. $\eta_{packaging}$ is the packaging efficiency and can be improved by using better phosphor conversion techniques.

Embodiments described herein may provide improvements in at least $\eta_{electrical}$ as well as $\eta_{extraction}$ in lateral LEDs, leading to improvements in total LED efficiency. Some embodiments provide an improved lateral LED device structure that may be employed in LEDs based on III-V compound semiconductors. In various embodiments an improved GaN-based lateral LED is provided. In some embodiments, an improved n-contact arrangement is provided that may include an $n^+$ doped region adjacent the n-contact. The terms "GaN based" or "GaN type," as used herein, may refer to a family of materials related to the GaN compound semiconductor. These materials may include doped or undoped GaN, InGaN ternary compounds, quantum well structures such as alternating layers of InGaN/GaN materials, as well as other related compounds as known in the art.

In one embodiment a method for forming a lateral LED includes etching a mesa in a GaN-based structure having a buried n-type GaN layer in order to form a mesa comprising an exposed mesa surface of n-doped GaN type material. The surface concentration of n-dopants in the n-doped mesa may be increased in a surface region of the mesa. In some embodiments, the level of n-type dopants is increased using ion implantation methods.

FIGS. 2a and 2b are a top plan view and perspective view of an embodiment of a lateral LED 200. Lateral LED 200 may be based on GaN or similar compounds in some embodiments. Consistent with known lateral LED structures, LED 200 has a pair of non-buried contacts 202, 210 on the same side (facing up in the figures) of LED 200. Lateral LED may be formed such that upper contact 202 is a p-contact and recessed contact 210 is an n-contact. The contacts 202 and 210 may be laterally displaced from one another along the x-direction (and/or y-direction) thereby forming a lateral LED structure.

In some embodiments, layer 204 may be p-GaN, layer 206 may be a known quantum well structure based on InGaN/GaN alternating layers (not separately shown) and layer 208 may be n-GaN. In some embodiments, a buffer layer 212 based on GaN-type material is provided between the n-GaN layer 208 and substrate 214.

In the embodiment of FIGS. 2a-2b, contact 210, which may be an n-contact, is formed upon a mesa 222 that is recessed below the level of contact 202. In some embodiments, the surface region 208a is a highly doped layer, such as an $n^+$ GaN layer. The highly doped layer 208a may be formed using ion implantation, as described in more detail below.

In operation, device 200 may emit light of a desired wavelength (range) according to known design considerations. For example, the wavelength of light emitted by LED 200 may be tuned by varying the thickness of alternating InGaN/GaN layer sequences used in quantum well layer 206. For sake of illustration only, it may be assumed in the discussion to follow that contact 202 is a p-contact and contact 210 is an n-contact.

The performance of LED 200 may be improved over conventional lateral LEDs because of the presence of highly doped layer 208a. Current traveling between region A underneath p/n junction region 216 and region B located beneath n-contact 210 must enter a highly doped mesa 208a that abuts the entire lower interface of n-contact 210. When the current enters into region 208a, the current may spread out significantly because the layer 208a may present a much lower resistance than that in lightly doped regions 208b of n-layer 208. After spreading out, the current may traverse between contact 210 and n-layer 208 over a large portion of the interface defined by the lower surface of contact 210. Accordingly, current crowding may be reduced, leading to reduced localized joule heating, reduced color binning, and longer device lifetime. Moreover, the presence of a high concentration of active dopants at the interface 210a between contact 210 and $n^+$ layer 208a may produce a low contact resistance in LED 200.

FIGS. 3-6 illustrate aspects of one particular embodiment of a method of forming lateral LEDs using ion implantation of a contact region. Other LED structures, both vertical and lateral, and other fabrication methods are possible. Thus, the embodiments disclosed herein are not limited solely to the embodiment of FIGS. 3-6.

FIG. 3 is a perspective view of a first step in an embodiment of LED 220 fabrication. In various embodiments, the layers 204-208 may be based on GaN, and may be grown on a substrate 214. In some embodiments, the layers 204-208 may be grown using epitaxial processes, such as using MOCVD, molecular beam epitaxy, atomic layer deposition, or other process. Layer 204 may be, for example, p-GaN and layer 208 may be n-GaN. Layer 206 may be a quantum well structure as discussed above.

In embodiments of layer 208, the layer thickness of n-GaN may be in the range of about 1-5 micrometers.

Figure 4:
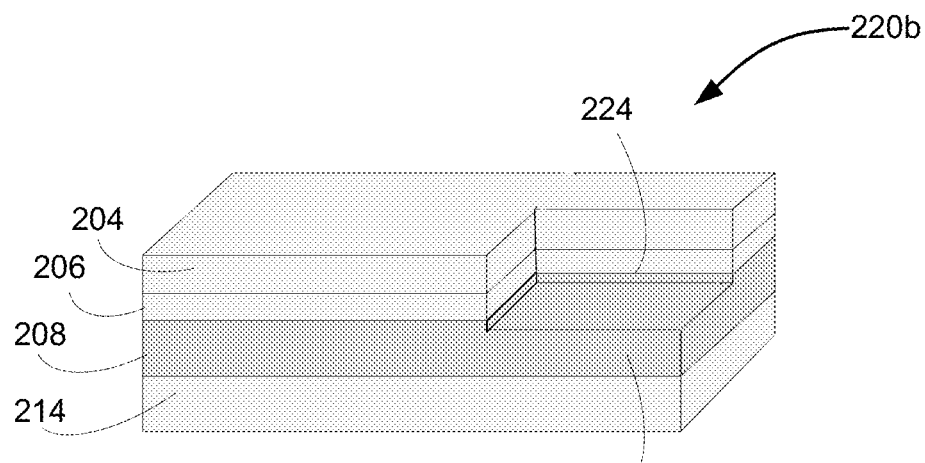
FIG. 4 is a perspective view of another step in an embodiment of LED fabrication.

FIG. 4 is a perspective view of another step in an embodiment of LED fabrication. After growth of layer stack 204-208, a mesa 222 is formed in the structure 220b using, for example, dry etching and known lithography techniques to selectively etch a portion of layers 204-208. In the embodiment shown, the entire thickness of each of layers 204 and 206 is etched away in one region corresponding to 204a. In some embodiments, a top portion 224 of n-layer 208 may be etched away leaving a remaining portion corresponding to mesa 222.

In embodiments of the fabrication process, a remaining thickness of mesa 222 may be on the order of one micrometer thickness and in particular, about 1-3 micrometers.

Figure 5A:
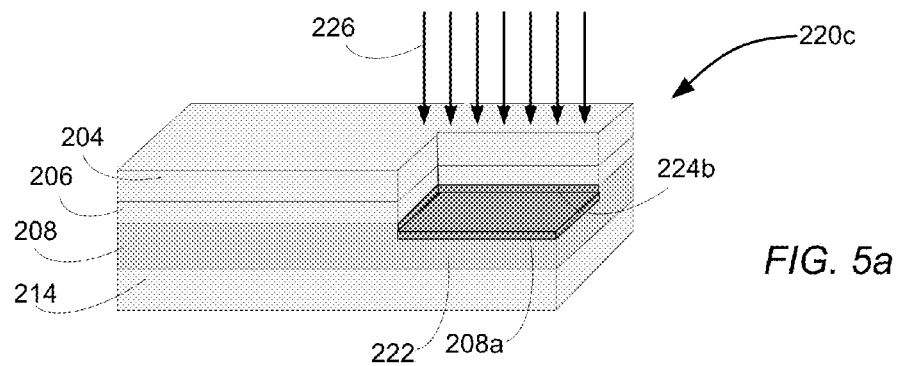
FIG. 5a is a perspective view of a further step in an embodiment of LED fabrication.

FIG. 5a is a perspective view of a further step in an embodiment of LED fabrication. At least one portion of the mesa 222 in the structure 220c may be implanted using ions 226 as described hereinbelow. Ion implantation may be used to improve current distribution and, consequently, $\eta_{electrical}$. As noted above, this implantation process may improve current crowding in an LED fabricated according to the steps of FIGS. 3-6. Current crowding may be improved because, for example, an n+ region is created in the structure 208a and more electrons exist throughout the implanted region 208a of the structure 220c. In some embodiments, the active carrier concentration of n-dopants in region 208a may be greater than about $1E19/cm^3$, while the active carrier concentration of n-dopants in layer 208 may be less than about $1E18/cm^3$.

In various embodiments the implanting ions are n+ dopants for GaN, which may include group IV elements, such as C, Si, Ge, Sn, or Pb, or group VI elements such as O or Se. Implantation of ions into an n-GaN region of a GaN LED may cause increased carrier concentration at the top surface of the n-GaN region. This may improve current spreading. Further, the implanted profile in the n-GaN layer can be a box profile or a Gaussian profile.

Implant energy and implant dose may depend on the base carrier concentration in layer 208, but in various embodiments, the ion energy may range from about 100 eV to about 50 keV. In particular, the ion energy may be about 1-10 keV. In order to provide a low resistance region corresponding to mesa 208a, the ion dose during implantation may be about $1E13-1E16/cm^2$, and more particularly may be about 5E14-5E15. In one particular embodiment the implant may be a low keV to high keV energy and approximately E13 to E15 $cm^{-2}$ dose. In some embodiments of the invention, the ion range for ions implanted into mesa 222 may be about 1-20 nm.

In some embodiments, the implantation step of FIG. 5a may also roughen the surface of the structure 208a, which improves $\eta_{extraction}$. The roughened surface may be supplemented by using nanorods, photon crystal structures, patterned structures, or surface gratings.

In some embodiments, the implantation step depicted generally at FIG. 5a may involve multiple implants. In some embodiments, the multiple implants may involve chained implants in which the substrate supporting the LED device is not handled between implants.

Figure 5B:
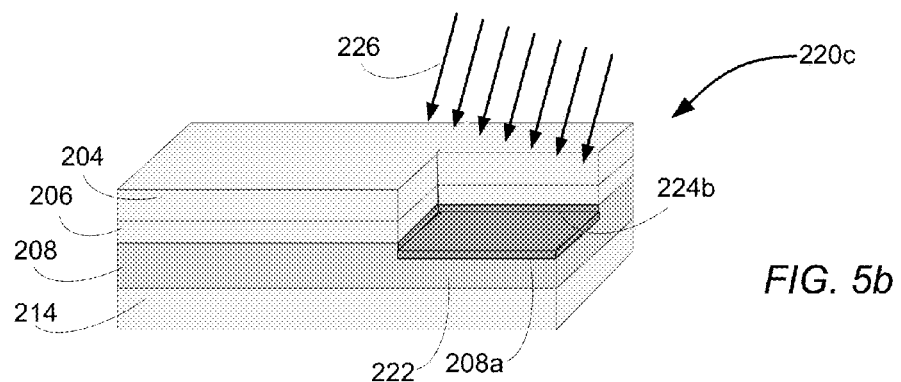
FIG. 5b is a perspective view of an alternative step in an embodiment of LED fabrication.

In various embodiments, as depicted at FIG. 5b, a non-zero angle of ion implantation may be used in addition to or instead of a substantially normal incidence implant as generally depicted in FIG. 5a. In some embodiments, the angled implant may be performed in steps, such as a chained implant sequence where vacuum around LED structure 220c is not broken between two or more implants.

Figure 5C:
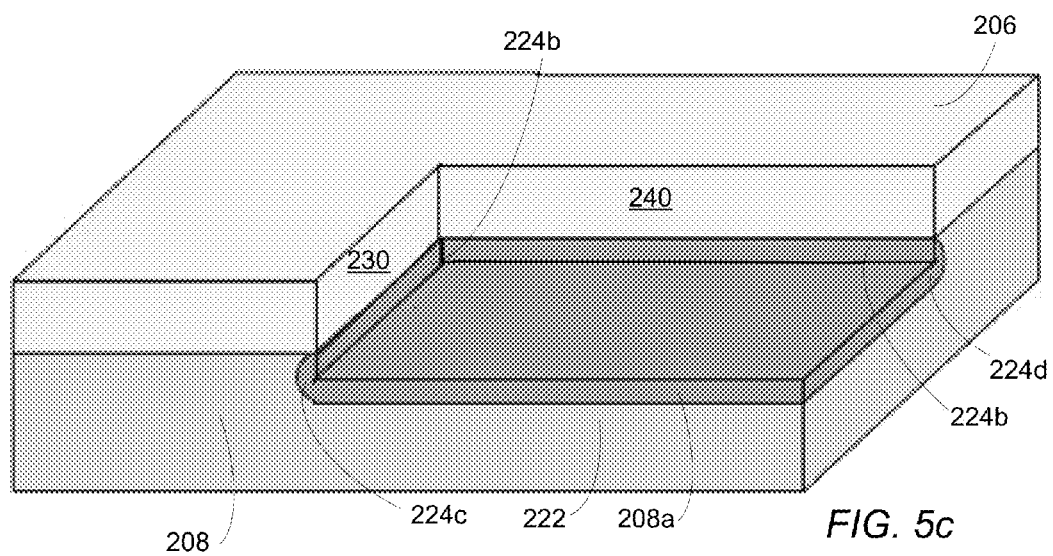
FIG. 5c is a perspective view showing a portion of an LED after ion implantation according to an embodiment of LED fabrication.

Angled implants of the walls or corners of the mesa 208a may be performed in one embodiment. As depicted in FIG. 5c, which illustrates a portion of structure 220c, the lower portions of walls 230, 240 that surround mesa 208a may be implanted, forming implanted wall regions 224b. These wall regions may extend into the n+ mesa 222 as illustrated in regions 224c, 224d. These implanted regions may further improve current crowding/current spreading by providing additional low resistance regions for current traveling between contacts 202 and 210. It is to be noted that the angled implants are only for regions 208a and 224b, which are n-doped regions of the LED, such as n-GaN, and not for the entire walls 230 and 240.

In some embodiments, the sidewalls 230, 240 may be implanted with species such as O, N, and/or C for isolation purposes.

In a substep of the implantation step of FIG. 5a or 5b, the structure 220c may be annealed after implantation in order to properly activate the implanted ions so that the implanted species become electron donors, thereby increasing the n-carrier concentration in mesa 222. In some embodiments, the thickness of mesa 222 after annealing may be about 1-20 nm and the carrier concentration may be about $1E19/cm^3$ or higher in mesa 222.

In some embodiments, the implanted mesa 222 may be annealed using laser annealing. The annealing may be in one shot or multiple shots in which exposure dose ranges from 200 mJ to 800 mJ. In some embodiments, a combination of a laser anneal (anneal #1) and rapid thermal anneal (RTA) (anneal #2) may be performed. The selection of temperature range of RTA anneal may be chosen based upon the prior Laser anneal step. The RTA temperature can range, for example, from 200° C. to 1200° C. In one embodiment of an n+ GaN mesa structure, a decrease in contact resistance may be produced, which may be greater than about 10%.

The rough surface or damage on the structure 220c caused by the implanted ions also may enhance $\eta_{extraction}$. This rough or damaged surface may be rich in vacancies. $\eta_{extraction}$ may be improved because by creating random texturing, light is scattered such that more light is extracted.

Figure 6:
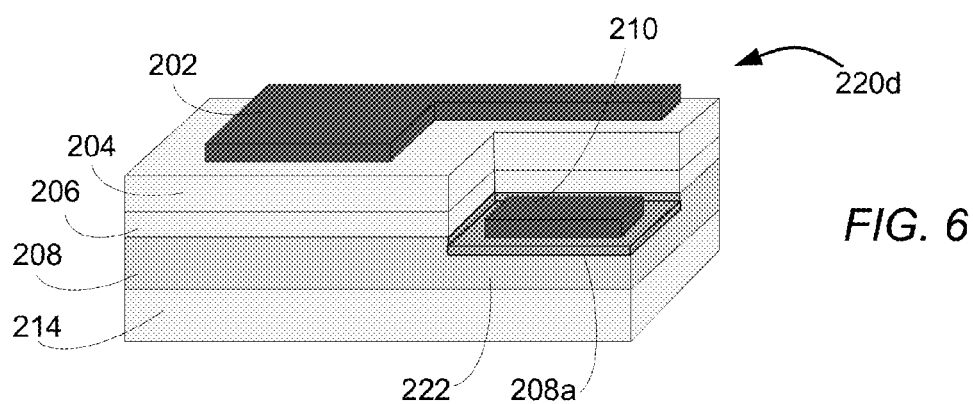
FIG. 6 is a perspective view of an additional step in an embodiment of LED fabrication.

FIG. 6 is a perspective view of an additional step in an embodiment of LED fabrication. N-metal and p-metal are applied to form final LED structure 220d. In some embodiments, the LED structure 220d may have improved current performance characteristics as described above with respect to LED 200. In contrast, if the structure 220d was not implanted as seen in FIG. 5a, the structure 220d could experience current crowding during device operation in the n-layer region 208 of the structure 220b that lies between the n-metal contact 210 and p-layer 204.

In an alternate embodiment, the texturing and surface roughening of the structure 200 may be performed by or supplemented by wet chemical etching.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, the LED electrodes (contacts) of the disclosed embodiments, although generally depicted as rectangular, may have any convenient shape. Moreover, embodiments of other lateral LED materials systems, including other III-IV compounds besides GaN are possible.

Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A lateral light emitting diode (LED), comprising:
   a layer stack disposed on one side of a substrate, the layer stack including a p-type layer, n-type layer, and a p/n junction formed therebetween;
   a p-electrode disposed on a first side of the substrate and being in contact with the p-type layer on an exposed surface; and
   an n-electrode disposed on the first side of the substrate and being in contact with an exposed surface of an n+ sub-layer of the n-type layer, wherein the n+ sub-layer is formed in both a wall of the layer stack and the exposed surface of the n+ sub-layer.

2. The lateral LED of claim 1, wherein the p-type and n-type layers comprise GaN.

3. The lateral LED of claim 1, the $n^+$ sub-layer comprising a mesa structure disposed in an outer region of an exposed portion of the n-type layer.

4. The lateral LED of claim 1, further comprising a quantum well structure disposed between the n-type and p-type layers.

5. The lateral LED of claim 1, the $n^+$ sub-layer being formed by implantation of first ions in an outer region of the n-type layer.

6. The lateral LED of claim 5, wherein an ion dose of the first ions in the $n^+$ sub-layer is about 1E13 to 1E16/cm$^2$.

7. The lateral LED of claim 5, the first ions comprising Si-containing species.

8. The lateral LED of claim 5, the $n^+$ sub-layer comprising a roughened top surface.

9. A method of forming a light emitting diode, comprising:
etching a portion of a layer stack comprising an n-type layer disposed facing a substrate, an outer p-type layer, and a p/n junction formed therebetween, so as to expose a portion of the n-type layer; and
implanting ions into an outer region of the exposed portion of the n-type layer so as to form an $n^+$ outer layer, wherein the ions are implanted at a non-zero angle with respect to a surface of the outer region.

10. The method of claim 9, further comprising forming an n-electrode on the $n^+$ outer layer.

11. The method of claim 9, the n-type layer and p-type layer each comprising GaN.

12. The method of claim 9, wherein the layer stack comprises a quantum well structure disposed between the n-type and p-type layers.

13. The method of claim 9, wherein the ions are implanted to a depth of about 1-20 nm.

14. The method of claim 9, the ions comprising one of group IV and group VI elements.

15. The method of claim 9, wherein an ion energy of the ions is about 100 eV to 50 keV and wherein an ion dose of the ions is about 1E13 to about 1E16/cm$^2$.

16. The method of claim 9, further comprising roughening an outer surface of the exposed portion of the n-type layer during the implanting.

17. The method of claim 9, further comprising implanting the ions into the outer region of the exposed portion of the n-type layer so as to form the $n^-$ outer layer, wherein the ions are implanted at a perpendicular angle with respect to the surface of the outer region.

18. The method of claim 9, further comprising annealing the n-type layer after the implanting.

19. The method of claim 18, wherein the annealing comprises laser annealing.

20. The method of claim 19, wherein the annealing comprises a combination of laser annealing and rapid thermal annealing.

* * * * *

UNITED STATES PATENT AND TRADEMARK OFFICE
CERTIFICATE OF CORRECTION

| | |
|---|---|
| PATENT NO. | : 8,502,192 B2 |
| APPLICATION NO. | : 12/987655 |
| DATED | : August 6, 2013 |
| INVENTOR(S) | : Joon Seop Kwak |

Page 1 of 1

It is certified that error appears in the above-identified patent and that said Letters Patent is hereby corrected as shown below:

In the Claims

Column 8, Claim 17, line 17,
Please replace "n- outer layer" with --n+ outer layer--

Signed and Sealed this
Fifteenth Day of October, 2013

Teresa Stanek Rea
*Deputy Director of the United States Patent and Trademark Office*